United States Patent
Kang et al.

(10) Patent No.: US 7,330,074 B2
(45) Date of Patent: Feb. 12, 2008

(54) DIFFERENTIAL AMPLIFIER WITH CASCADE CONTROL

(75) Inventors: Jae-Sung Kang, Suwon-si (KR); Chang-Mi Park, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 133 days.

(21) Appl. No.: 11/220,186

(22) Filed: Sep. 6, 2005

(65) Prior Publication Data

US 2006/0066400 A1 Mar. 30, 2006

(30) Foreign Application Priority Data

Sep. 24, 2004 (KR) ............ 10-2004-0077157

(51) Int. Cl.
*H03F 3/45* (2006.01)
(52) U.S. Cl. ............................ 330/255; 330/261
(58) Field of Classification Search ........... 330/255, 330/257, 258, 261
See application file for complete search history.

(56) References Cited

U.S. PATENT DOCUMENTS

| | | | |
|---|---|---|---|
| 5,311,145 A | 5/1994 | Huijsing et al. | 330/255 |
| 6,124,705 A | 9/2000 | Kwong | 323/316 |
| 6,384,683 B1 * | 5/2002 | Lin | 330/257 |
| 6,624,696 B1 * | 9/2003 | Eschauzier et al. | 330/255 |
| 6,657,495 B2 * | 12/2003 | Ivanov et al. | 330/255 |
| 6,714,076 B1 * | 3/2004 | Kalb | 330/255 |
| 6,828,855 B1 * | 12/2004 | Wang | 330/253 |

OTHER PUBLICATIONS

IEEE 1991, *A Digital Process Compatible High-Drive CMOS Op Amp with Rail-to-Rail Input and Output Ranges*, Wu et al., pp. 692-695.

* cited by examiner

*Primary Examiner*—Henry Choe
(74) *Attorney, Agent, or Firm*—Monica H. Choi (57) ABSTRACT

A differential amplifier includes an input stage, an output stage, and a control unit. The input stage generates differential currents in response to a voltage difference between differential input signals. The output stage generates an output signal at an output node. The control unit is coupled between the input stage and the output stage and includes a floating current source comprised of a cascode load for biasing the output stage with a quiescent current. Such a cascode load increases DC gain of the differential amplifier.

20 Claims, 4 Drawing Sheets

DIFFERENTIAL AMPLIFIER WITH CASCADE CONTROL

BACKGROUND OF THE INVENTION

This application claims priority to Korean Patent Application No. 2004-77157, filed Sep. 24, 2004 in the Korean Intellectual Property Office, the disclosure of which is incorporated herein in its entirety by reference.

1. Field of the Invention

The present invention relates to differential amplifiers, and more particularly, to a differential amplifier having class AB control with cascode loading for increased gain and reduced offset.

2. Description of the Related Art

A push-pull amplifier circuit including CMOS (complementary metal oxide semiconductor) transistors is an often used circuit. An audio amplifier circuit is typically an analog amplifier circuit or a digital amplifier circuit.

An analog amplifier circuit is classified into one of a class A amplifier circuit, a class B amplifier circuit, or a class AB amplifier circuit, and a digital amplifier circuit is classified as a class D amplifier circuit. Since linearity is considered more important than high efficiency in an audio amplifier circuit, an analog amplifier which is a linear amplifier is generally used for the audio amplifier.

The class A, B, and AB amplifier circuits have recently been used as analog amplifier circuits because of their higher linearity. However, such amplifiers consume relatively high power for generating high output. That is, analog amplifiers have the advantage of high linearity, but the disadvantage of low efficiency.

Specifically, in a class A analog amplifier, much more power is dissipated than the maximum output of the amplifier, and therefore the efficiency of the amplifier is typically not more than 25%. The class B push-pull amplifier overcomes the efficiency problem of the class A amplifier with two transistors coupled to each other in an emitter follower configuration. However, the class B push-pull amplifier has crossover distortion for low signal levels.

Further, although the transistors of the class B push-pull amplifier are easily turned on and off for small currents, such transistors cannot be rapidly turned on and off for large currents. More specifically, since no bias current flows in the class B amplifier when in an idle (i.e., static) state, it is difficult to rapidly turn the transistors on/off for large currents resulting in increased total harmonic distortion (THD).

In the class AB amplifier, a small amount of current flows through the amplifier in the idle state. Such current is much smaller than in the class A amplifier but larger than in the class B amplifier. That is, with higher amount of current in the idle state, the class AB amplifier becomes more similar to the class A amplifier, and with lower amount of current in the idle state, the class AB amplifier becomes more similar to the class B amplifier.

U.S. Pat. No. 5,311,145 to Huijsing et al. describes a floating class AB control terminal in a differential amplifier. A class AB control terminal controls a cross over point of the differential amplifier with a quiescent current in the idle state in order to prevent distortion of an output signal. Further, high gain is maintained with positive feedback.

Control of currents in a differential amplifier is desired with high amplifier gain in both static and active operating states.

SUMMARY OF THE INVENTION

A differential amplifier according to the present invention has class AB control with cascode load for increased gain and reduced offset.

In a general aspect of the present invention, a differential amplifier includes an input stage, an output stage, and a control unit. The input stage generates differential currents in response to a voltage difference between differential input signals. The output stage generates an output signal at an output node. The control unit is coupled between the input stage and the output stage and includes a floating current source comprised of a cascode of at least two transistors for biasing the output stage with a quiescent current.

In one embodiment of the present invention, the floating current source biases the output stage with the quiescent current when the voltage difference between the differential input signals is substantially zero.

In another embodiment of the present invention, the control unit further includes a current summing circuit for adjusting an output current through the output stage for determining the output signal in response to the differential currents from the input stage.

In a further embodiment of the present invention, the current summing circuit is comprised of first and second cascode current mirrors. The first cascode current mirror is disposed between a high power supply and a first control node, and the second cascode current mirror is disposed between a low power supply and a second control node.

In that case, the floating current source is coupled between the first and second control nodes. In an example embodiment of the present invention, the floating current source includes a first cascode of a top NMOSFET and a bottom NMOSFET with a drain of the top NMOSFET coupled to the first control node and a source of the bottom NMOSFET coupled to the second control node. In addition, the floating current source includes a second cascode of a top PMOSFET and a bottom PMOSFET with a source of the top PMOSFET coupled to the first control node and a drain of the bottom PMOSFET coupled to the second control node.

In another embodiment of the present invention, the differential amplifier further includes first and second compensating capacitors. The first compensating capacitor is coupled between the output node and a side of the first cascode current mirror, and the second compensating capacitor is coupled between the output node and a side of the second cascode current mirror.

In a further embodiment of the present invention, the input stage is a folded cascode operational transconductance amplifier (OTA). In that case, the input stage includes differentially coupled NMOSFETs and differentially coupled PMOSFETs. In that case, the differential input signals are applied across gates of the differentially coupled NMOSFETs and across gates of the differentially coupled PMOSFETs.

In another embodiment of the present invention, the output stage includes a PMOSFET coupled between the high power supply and the output node and having a gate coupled to the first control node. In addition, the output stage includes an NMOSFET coupled between the low power supply and the output node and having a gate coupled to the second control node.

In this manner, with cascode loading from the cascode current mirrors and the floating current source, the gain of the differential amplifier is increased.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, and 4 refer to elements having similar structure and/or function.

DETAILED DESCRIPTION OF THE INVENTION

Figure 1:
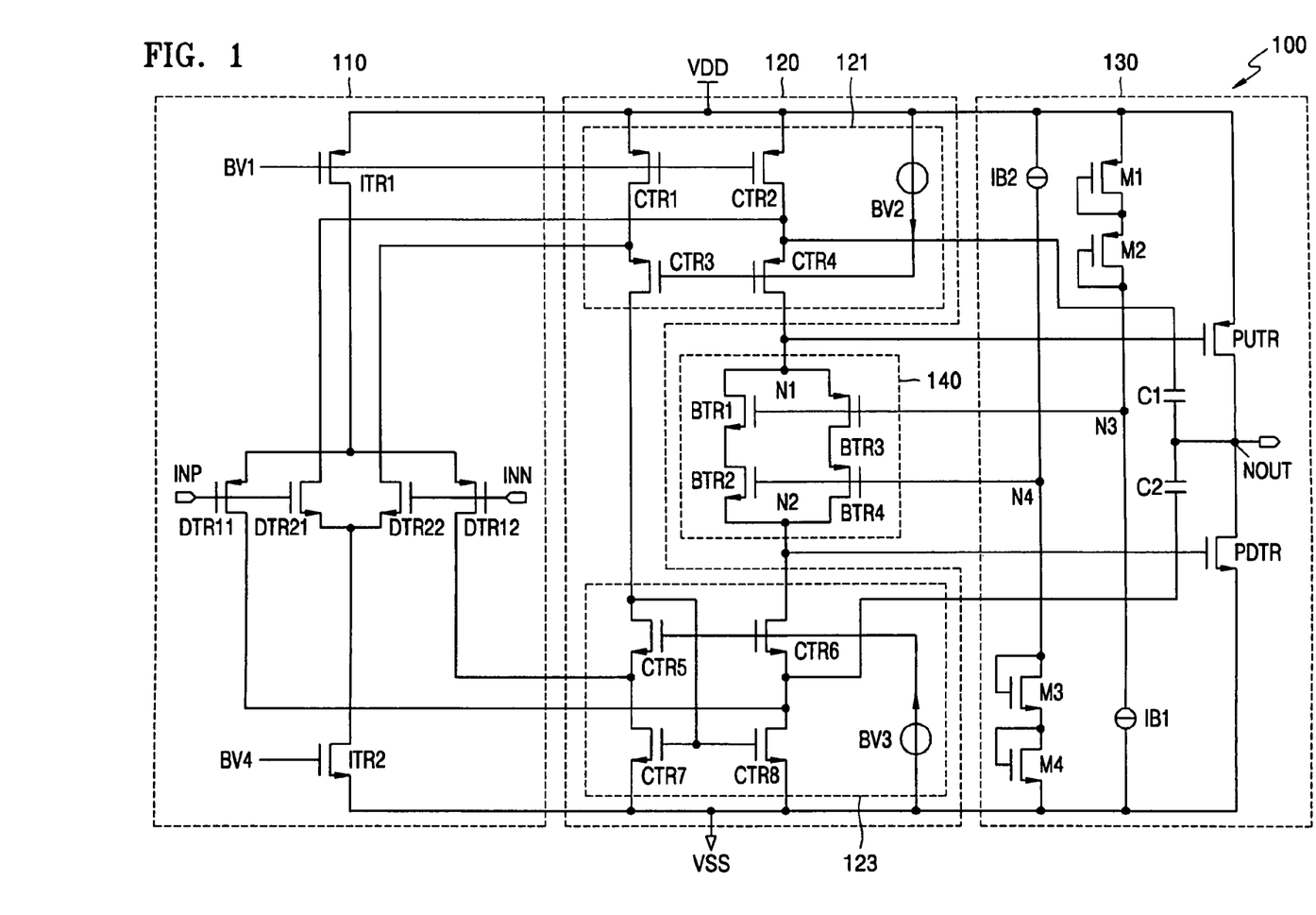
FIG. 1 is a circuit diagram of a differential amplifier according to an embodiment of the present invention.

FIG. 1 shows a circuit diagram of a differential amplifier 100 according to an embodiment of the present invention. Referring to FIG. 1, the differential amplifier 100 includes an input stage 110, a current summing circuit 120, an output stage 130, and a floating current source 140.

The input stage 110 includes a pair of differentially coupled PMOSFETs (P-channel metal oxide semiconductor field effect transistors) DTR11 and DTR12 coupled to a high power supply VDD through another PMOSFET ITR1. Further, the input stage 110 includes a pair of differentially coupled NMOSFETs (N-channel metal oxide semiconductor field effect transistors) DTR21 and DTR22 coupled to a low power supply VSS through another NMOSFET ITR2. The low power supply VSS may be the ground node for example.

The input stage 110 is a folded cascode operational transconductance amplifier (OTA). The folded cascode OTA converts a voltage difference between differential input signals INP and INN into differential currents that are further transmitted for determining an output signal at an output node NOUT.

A source of the PMOSFET ITR1 is connected to the high power supply VDD, and a first bias voltage BV1 is applied to a gate of the PMOSFET ITR1. The differentially coupled PMOSFETs DTR11 and DTR12 comprise a first differential amplifier for amplifying the voltage difference between the differential input signals INP and INN. Sources of the PMOSFETs DTR11 and DTR12 are coupled to a drain of the PMOSFET ITR1, and drains of the PMOSFETs DTR11 and DTR12 are coupled to the current summing circuit 120.

A source of the NMOSFET ITR2 is coupled to the low power supply VSS, and a fourth bias voltage BV4 is applied to a gate of the NMOSFET ITR2. The differentially coupled NMOSFETs DTR21 and DTR22 comprise a second differential amplifier for amplifying the voltage difference between the differential input signals INP and INN. Sources of the NMOSFETS DTR21 and DTR22 are coupled to a drain of the NMOSFET ITR2, and drains of the NMOSFETS DTR21 and DTR22 are coupled to the current summing circuit 120.

The current summing circuit 120 includes a first cascode current mirror 121 and a second cascode current mirror 123. The first cascode current mirror 121 is coupled between the high power supply VDD and a first control node N1. More specifically, the first cascode current mirror 121 includes first and second control PMOSFETs CTR1 and CTR2 controlled in response to the first bias voltage BV1, and third and fourth control PMOSFETs CTR3 and CTR4 controlled in response to a second bias voltage BV2. The control PMOSFETs CTR1 and CTR3 are coupled in series as a cascode to the high power supply VDD, and control PMOSFETs CTR2 and CTR4 are coupled in series as a cascode between the high power supply VDD and the first control node N1.

The second cascode current mirror 123 is coupled between the low power supply VSS and a second control node N2. The second cascode current mirror 123 includes fifth and sixth control NMOSFETs CTR5 and CTR6 controlled in response to a third bias voltage BV3. In addition, the fifth control NMOSFET CTR5 and a seventh control NMOSFET CTR7 are coupled in series as a cascode between a drain of the third control PMOSFET CTR3 and the second control node N2.

Similarly, the sixth control NMOSFET CTR6 and an eighth control NMOSFET CTR8 are coupled in series as a cascode between the low power supply VSS and the second control node N2. Furthermore, a drain of the fifth control transistor CTR5 is coupled to gates of the seventh and eighth NMOSFETs CTR7 and CTR8.

The drain of the NMOSFET DTR22 from the input stage 110 is coupled to a left side of the first cascode current mirror 121 at the drain of the first control PMOSFET CTR1. The drain of the NMOSFET DTR21 from the input stage 110 is coupled to a right side of the first cascode current mirror 121 at the drain of the second control PMOSFET CTR2.

The drain of the PMOSFET DTR12 from the input stage 110 is coupled to a left side of the second cascode current mirror 123 at the drain of the seventh control NMOSFET CTR7. The drain of the PMOSFET DTR11 from the input stage 110 is coupled to a right side of the second cascode current mirror 123 at the drain of the eighth control NMOSFET CTR8.

The input stage 110 and the current summing circuit 120 control the current levels through the differential amplifier 100. That is, the input stage 110 generates differential currents from the voltage difference between the differential input signals INP and INN. Such differential currents are transmitted to the current summing circuit 120 that in turn controls the voltage levels at the first and second control nodes N1 and N2 by using the two cascode current mirrors 121 and 123. Thus, the input stage 110 and the current summing circuit 120 form embedded current sources which are controlled by the bias voltages BV1, BV2, BV3, and BV4.

The output circuit 130 includes a PMOSFET PUTR and an NMOSFET PDTR having drains coupled together at an output node NOUT. The gate of the PMOSFET PUTR is coupled to the first control node N1, and the gate of the NMOSFET PDTR is coupled to the second control node N2.

The output circuit 130 further includes a first biasing branch comprised of a first current source IB1 and diode-connected PMOSFETs M1 and M2 between the high power supply VDD and the low power supply VSS. In addition, the output circuit 130 includes a second biasing branch comprised of a second current source IB2 and diode-connected NMOSFETs M3 and M4 between the high power supply VDD and the low power supply VSS. Such first and second biasing branches provide biasing voltages to the floating current source 140 which is described below.

The PMOSFET PUTR has a source coupled to the high power supply VDD, a drain coupled to the output node NOUT, and a gate coupled to the first control node N1. The NMOSFET PDTR has a source coupled to the low power supply VSS, a drain coupled to the output node NOUT, and a gate coupled to the second control node N2.

A first compensating capacitor C1 is coupled between the output node NOUT and the right side of the first cascode current mirror 121. A second compensating capacitor C2 is coupled between the output node NOUT and the right side of the second cascode current mirror 123.

The floating current source 140 is coupled between the first and second control nodes N1 and N2 of the current summing circuit 120. The floating current source 140 includes first, second, third, and fourth bias transistors BTR1, BTR2, BTR3 and BTR4. The first and second bias transistors BTR1 and BTR2 are upper and bottom NMOSFETs, respectively, coupled in series as a cascode between the first and second control nodes N1 and N2. The third and fourth bias transistors BTR3 and BTR4 are upper and bottom PMOSFETs, respectively, coupled in series between the first and second control nodes N1 and N2.

The first and third bias transistors BTR1 and BTR3 are coupled in parallel, and the second and fourth bias transistors BTR2 and BTR 4 are coupled in parallel. Thus, gates of the first and third bias transistors BTR1 and BTR3 are coupled to a third node N3 between the diode-connected PMOSFET M2 and the first current source IB1. Gates of the second and fourth bias transistors BTR2 and BTR4 are coupled to a fourth node N4 between the diode-connected NMOSFET M3 and the second current source IB2.

The floating current source 140 having the cascode coupled bias transistors BTR1, BTR2, BTR3 and BTR4 controls the class AB operation of the differential amplifier 100. With such cascode loading within the floating current source 140, the resistive load is increased to in turn increase the DC gain of the differential amplifier 100. Moreover, increased DC gain results in reduced offset in the differential amplifier 100.

While the embodiment illustrated in FIG. 1 has been particularly shown and described, it will be understood by those skilled in the art that various changes in form and details may be made therein without departing from the spirit and scope of the invention. For example, by using semiconductor elements with polarities opposite to those of the above-described embodiment, an identical result may be obtained. Further, instead of the above-described field effect transistors, bipolar transistors may instead be used.

The current summing circuit 120 and the floating current source 140 form a control unit in the differential amplifier 100 that controls the current flowing through the output stage 130 in response to the differential currents generated by the input stage 110. Such operation of the differential amplifier 100 is now described in reference to FIGS. 2, 3, and 4.

Figure 2:
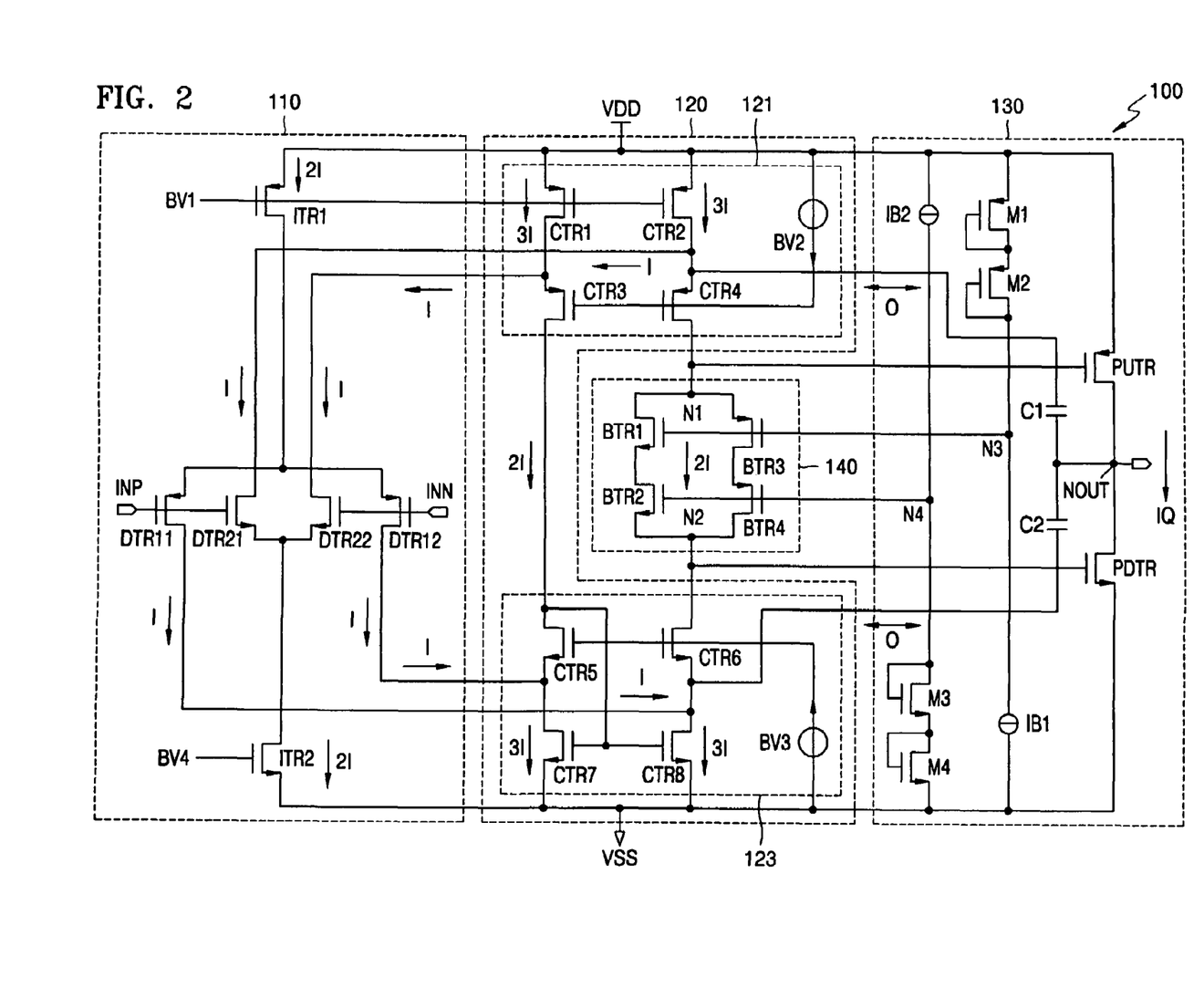
FIG. 2 is the circuit diagram of the differential amplifier of FIG. 1 with currents during an idle operating state, according to an embodiment of the present invention.

FIG. 2 is a circuit diagram for explaining an idle operating state in the differential amplifier 100 of FIG. 1. In FIG. 2, the voltage levels of the differential input signals INP and INN are substantially equal. Thus, the voltage difference between the differential input signals INP and INN is substantially zero. In that case, for operating the differential amplifier 100 as a class AB amplifier, the control unit, comprised of the current summing circuit 120 and the floating current source 140, causes a quiescent current IQ to flow through the output stage 130 including through the output node NOUT.

In FIG. 2, assume that a current of 2I flows in the first transistor ITR1 and a current of 3I flows in the first and second control transistors CTR1 and CTR2 due to the first bias voltage BV1. In FIG. 2, when the differential input signals INP and INN are substantially equal, a fixed current of 3I flows through the control transistors CRT1, CTR2, CTR7, and CTR8 of the first and second cascode current mirrors 121 and 123.

A current of 1I flows through each of the differentially coupled NMOSFETs DTR21 and DTR22 and the differentially coupled PMOSFETs DTR11 and DTR12. In addition, a current of 2I flows through the third and fifth control transistors CTR3 and CTR5, and a current of 2I flows through the floating current source 140. Such currents are summed together to result in the current of 3I flowing through the control transistors CRT1, CTR2, CTR7, and CTR8. In FIG. 2, the voltage levels of the first and second control nodes N1 and N2 remain constant.

Since all currents flowing through the first cascode current mirror 121 just flows through the second cascode current mirror 123, substantially zero current flows through the compensating capacitors C1 and C2. Thus, the compensating capacitors C1 and C2 are not charged or discharged in FIG. 2. A quiescent current IQ flows through the transistors PUTR and PDTR in the output stage 130 including through the output node NOUT. The level of the quiescent current is determined by the biasing from the diode-connected transistors M1, M2, M3, and M4 and the floating current source 140.

Figure 3:
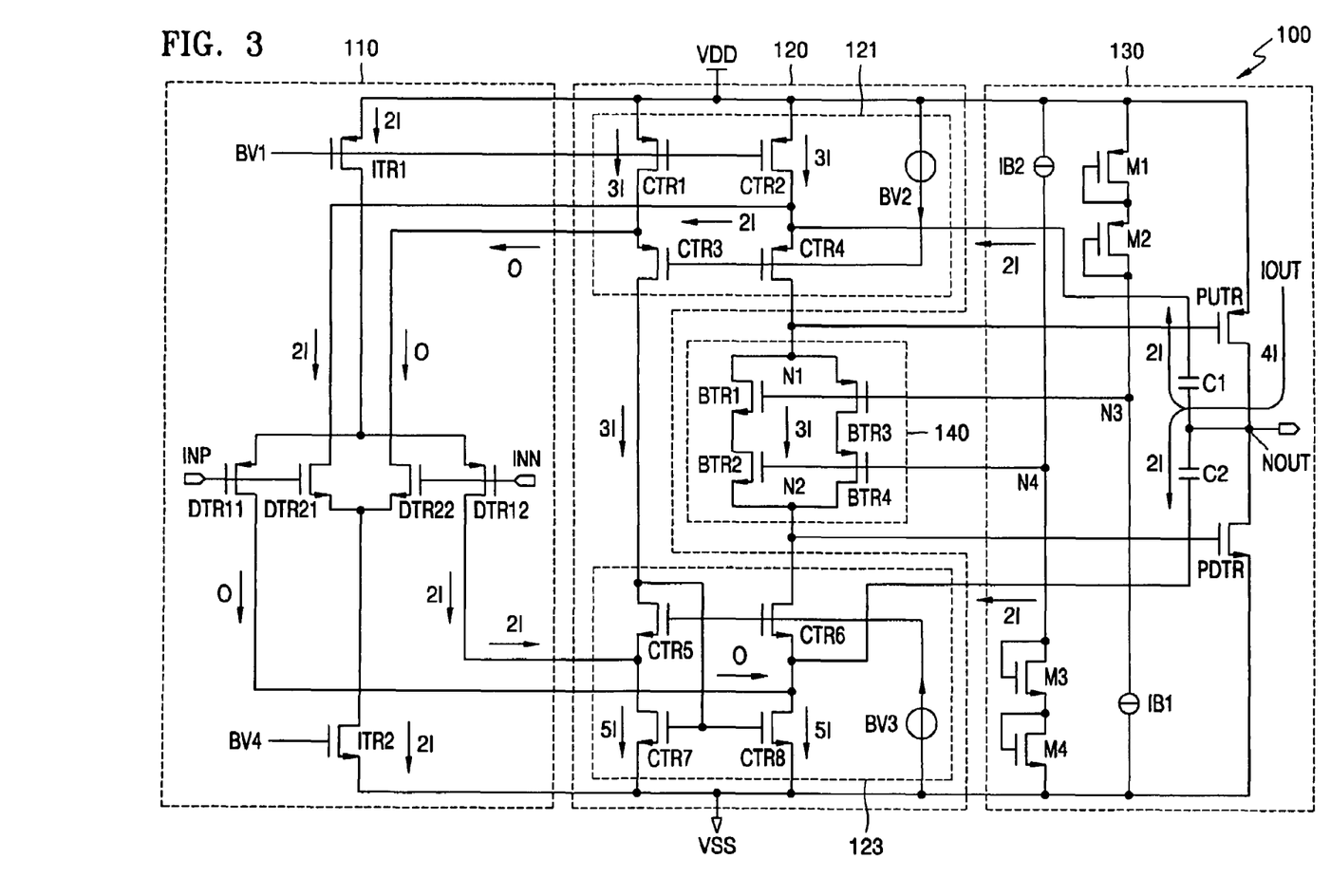
FIG. 3 is a circuit diagram of the differential amplifier of FIG. 1 with currents during an active operating state for amplifying a positive voltage difference between differential input signals, according to an embodiment of the present invention.

FIG. 3 is a circuit diagram for explaining an active operating state of the differential amplifier 100 in FIG. 1. In FIG. 3, the voltage level of the positive input signal INP is higher than that of the negative input signal INN. In that case, the left NMOSFET DTR21 and the right PMOSFET DTR12 are turned on while the right NMOSFET DTR22 and the left PMOSFET DTR11 are turned off in the input stage 110.

Consequently, a current of 2I flows through each of the turned-on transistors DTR12 and DTR21, while substantially zero current flows through the turned-off transistors DTR11 and DTR22. The current of 2I flows out from the right side of the first cascode current mirror 121 coupled to the transistor DTR21. Such current of 2I is generated by charges stored in the first compensating capacitor C1. Initially, a current of 2I flows to each of the first and second cascode current mirrors 121 and 123 due to charge stored in the compensating capacitors C1 and C2.

Since current continuously flows to the transistor DTR21 from the node of the first cascode current mirror 121 coupled to the transistor DTR21, the voltage levels at such a node and thus at the first control node N1 goes down in FIG. 3. Accordingly, the PMOSFET PUTR in the output stage 130 is turned on more strongly such that more current flows there-through. Such current flows into the output node NOUT in order to store charge at the output node NOUT including the compensating capacitors C1 and C2.

Eventually, such charging of the output node NOUT also results in an output signal at the output node NOUT that is an amplification of the voltage difference between the differential input signals INP and INN. Furthermore, during such an active operating state as illustrated in FIG. 3, because of the high cascode resistive load of the bias transistors BTR1, BTR2, BTR3, and BTR4 in the floating current source 140, the DC gain of the differential amplifier 100 is increased. Such increased DC gain results in decreased offset of the differential amplifier 100.

Figure 4:
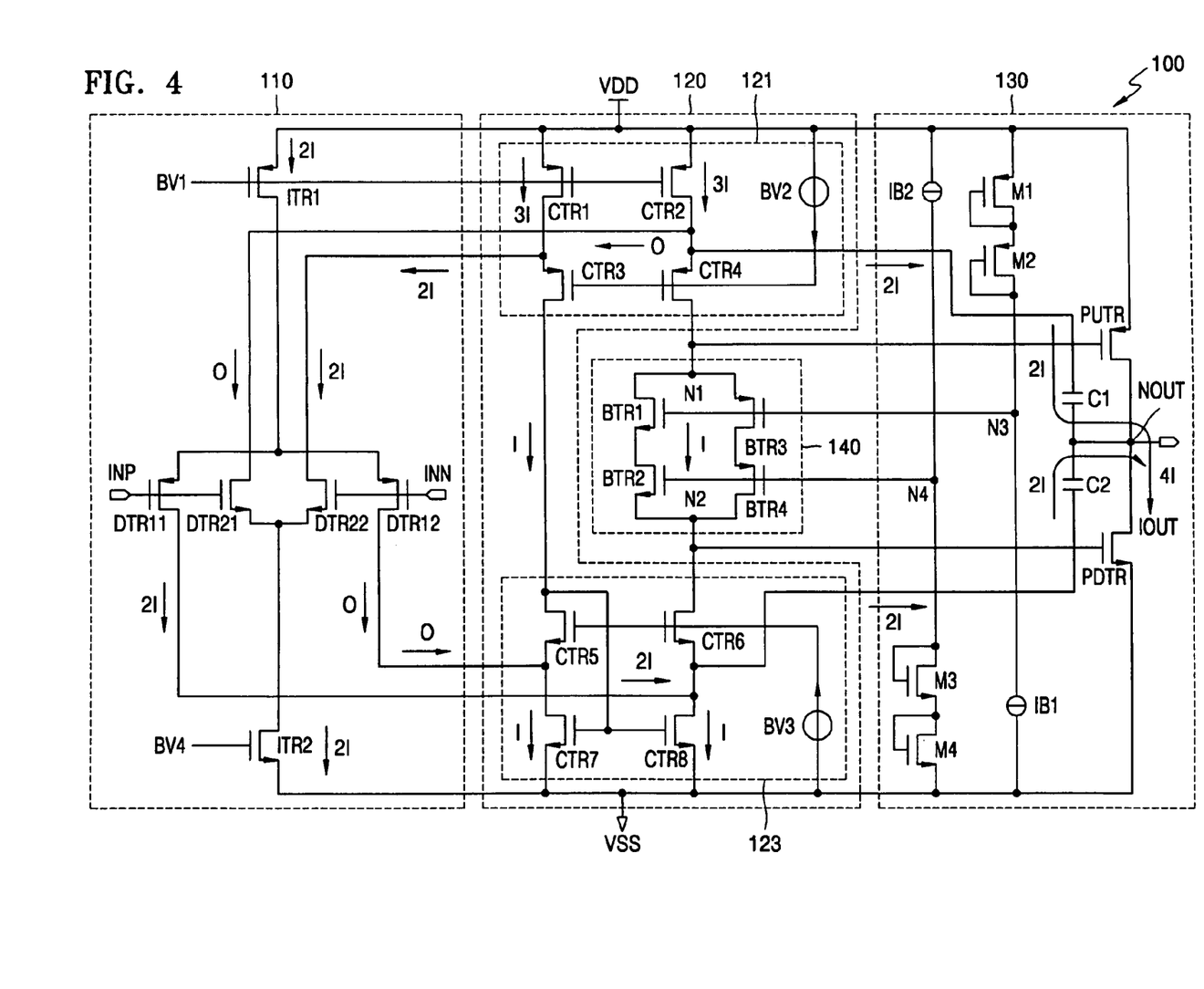
FIG. 4 is a circuit diagram of the differential amplifier of FIG. 1 with currents during an active operating state for amplifying a negative voltage difference between differential input signals, according to an embodiment of the present invention.

FIG. 4 is a circuit diagram for explaining still another active operating state of the differential amplifier circuit in FIG. 1 when the voltage level of the positive input signal INP is less than that of the negative input signal INN. In that case, the left NMOSFET DTR21 and the right PMOSFET DTR12 are turned off while the right NMOSFET DTR22 and the left PMOSFET DTR11 are turned on in the input stage 110.

Consequently, a current of 2I flows each of through the turned-on transistors DTR22 and DTR11, while substantially zero current flows through the turned-off transistors DTR21 and DTR12. The current of 2I flows to the right side of the second cascode current mirror 123 at the node coupled to the transistor DTR11.

Since current continuously flows from the transistor DTR11 to the node of the second current mirror circuit 123 coupled to the transistor DTR11, the voltage levels at such a node and thus at the second control node N2 are increased. Consequently, the NMOSFET PDTR in the output stage 130 is turned on more strongly such that more current flows there-through. Such current flows from the output node NOUT in order to discharge the output node NOUT including the compensating capacitors C1 and C2. Initially, a current of 2I flows from each of the first and second cascode current mirrors 121 and 123 to the compensating capacitors C1 and C2.

Eventually, such discharging of the output node NOUT also results in the output signal at the output node NOUT that is an amplification of the voltage difference between the differential input signals INP and INN. Also during such an active operating state as illustrated in FIG. 4, because of the high cascode resistive load of the bias transistors BTR1, BTR2, BTR3, and BTR4 in the floating current source 140, the DC gain of the differential amplifier 100 is increased. Such increased DC gain results in decreased offset of the differential amplifier 100.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A differential amplifier comprising:
   an input stage that generates differential currents in response to a voltage difference between differential input signals;
   an output stage for generating an output signal at an output node; and
   a control unit coupled between the input stage and the output stage, wherein the control unit includes a floating current source comprised of a cascode of at least two transistors for biasing the output stage with a quiescent current, and wherein the control unit further includes:
   a current summing circuit for adjusting an output current through the output stage for determining the output signal in response to the differential currents from the input stage, and wherein the current summing circuit is comprised of:
   a first cascode current mirror disposed between a high power supply and a first control node; and
   a second cascode current mirror disposed between a low power supply and a second control node;
   wherein the input stage is a folded cascode operational transconductance amplifier (OTA).

2. The differential amplifier of claim 1, wherein the input stage includes:
   differentially coupled NMOSFETs with a drain of one of the differentially coupled NMOSFETs coupled to a first side of the first cascode current mirror and with a drain of the other of the differentially coupled NMOSFETs coupled to a second side of the first cascode current mirror; and
   differentially coupled PMOSFETs with a drain of one of the differentially coupled PMOSFETs coupled to a first side of the second cascode current mirror and with a drain of the other of the differentially coupled PMOSFETs coupled to a second side of the second cascode current mirror,
   wherein the differential input signals are applied across gates of the differentially coupled NMOSFETs and across gates of the differentially coupled PMOSFETs.

3. The differential amplifier of claim 2, further comprising:
   a first compensating capacitor coupled between the output node and the second side of the first cascode current mirror; and
   a second compensating capacitor coupled between the output node and the second side of the second cascode current mirror.

4. The different amplifier of claim 1, wherein the floating current source is coupled between the first and second control nodes.

5. The differential amplifier of claim 4, wherein the floating current source is comprised of:
   a first cascode of a top NMOSFET and a bottom NMOSFET with a drain of the top NMOSFET coupled to the first control node and a source of the bottom NMOSFET coupled to the second control node; and
   a second cascode of a top PMOSFET and a bottom PMOSFET with a source of the top PMOSFET coupled to the first control node and a drain of the bottom PMOSFET coupled to the second control node.

6. The differential amplifier of claim 5, further comprising:
   a first biasing branch comprised of a first series of diodes coupled between the high power supply and gates of the top NMOSFET and the top PMOSFET; and
   a second biasing branch comprised of a second series of diodes coupled between the low power supply and gates of the bottom NMOSFET and the bottom PMOSFET.

7. The differential amplifier of claim 1, wherein the output stage includes:
   a PMOSFET coupled between the high power supply and the output node and having a gate coupled to the first control node; and
   an NMOSFET coupled between the low power supply and the output node and having a gate coupled to the second control node.

8. The differential amplifier of claim 1, wherein the floating current source biases the output stage with the quiescent current when the voltage difference between the differential input signals is substantially zero.

9. The differential amplifier of claim 1, further comprising:
   a first compensating capacitor coupled between the output node and a side of the first cascode current mirror; and a second compensating capacitor coupled between the output node and a side of the second cascode current mirror.

10. A differential amplifier comprising:
an input stage that generates differential currents in response to a voltage difference between differential input signals;
an output stage for generating an output signal at an output node, the output stage including field effect transistors; and
a control unit coupled between the input stage and the output stage, wherein the control unit includes a floating current source comprised of a cascode of at least two transistors coupled between control nodes for biasing the output stage with a quiescent current,
wherein the control nodes of the floating current source are directly connected to gates of the field effect transistors of the output stage.

11. The differential amplifier of claim 10, wherein the floating current source biases the output stage with the quiescent current when the voltage difference between the differential input signals is substantially zero.

12. The differential amplifier of claim 10, wherein the control unit further includes:
a current summing circuit for adjusting an output current through the output stage for determining the output signal in response to the differential currents from the input stage, wherein the current summing circuit is comprised of:
a first cascode current mirror disposed between a high power supply and a first control node; and
a second cascode current mirror disposed between a low power supply and a second control node.

13. The differential amplifier of claim 12, wherein the input stage is a folded cascode operational transconductance amplifier (OTA), and wherein the input stage includes:
differentially coupled NMOSFETs with a drain of one of the differentially coupled NMOSFETs coupled to a first side of the first cascode current mirror and with a drain of the other of the differentially coupled NMOSFETs coupled to a second side of the first cascode current mirror;
differentially coupled PMOSFETs with a drain of one of the differentially coupled PMOSFETs coupled to a first side of the second cascode current mirror and with a drain of the other of the differentially coupled PMOSFETs coupled to a second side of the second cascode current mirror,
wherein the differential input signals are applied across gates of the differentially coupled NMOSFETs and across gates of the differentially coupled PMOSFETs;
a first compensating capacitor coupled between the output node and the second side of the first cascode current mirror; and
a second compensating capacitor coupled between the output node and the second side of the second cascode current mirror.

14. The different amplifier of claim 12, wherein the floating current source is coupled between the first and second control nodes, and wherein the floating current source is comprised of:
a first cascode of a top NMOSFET and a bottom NMOSFET with a drain of the top NMOSFET coupled to the first control node and a source of the bottom NMOSFET coupled to the second control node; and
a second cascode of a top PMOSFET and a bottom PMOSFET with a source of the top PMOSFET coupled to the first control node and a drain of the bottom PMOSFET coupled to the second control node;
and wherein the differential amplifier further includes:
a first biasing branch comprised of a first series of diodes coupled between the high power supply and gates of the top NMOSFET and the top PMOSFET; and
a second biasing branch comprised of a second series of diodes coupled between the low power supply and gates of the bottom NMOSFET and the bottom PMOSFET.

15. The differential amplifier of claim 12, wherein the output stage includes:
a PMOSFET coupled between the high power supply and the output node and having a gate coupled to the first control node; and
an NMOSFET coupled between the low power supply and the output node and having a gate coupled to the second control node.

16. A differential amplifier comprising:
an input stage that generates differential currents in response to a voltage difference between differential input signals;
an output stage for generating an output signal at an output node, the output stage including field effect transistors;
a control unit coupled between the input stage and the output stage, wherein the control unit includes a floating current source comprised of a cascode of at least two transistors coupled between control nodes for biasing the output stage with a quiescent current, and wherein the control unit further includes:
a current summing circuit for adjusting an output current through the output stage for determining the output signal in response to the differential currents from the input stage, and wherein the current summing circuit includes
a first cascode current mirror disposed between a high power supply and a first control node; and
a second cascode current mirror disposed between a low power supply and a second control node;
a first compensating capacitor coupled between the output node and a side of the first cascode current mirror, and wherein the first compensating capacitor is not directly connected to any control nodes of the floating current source; and
a second compensating capacitor coupled between the output node and a side of the second cascode current mirror, and wherein the second compensating capacitor is not directly connected to any control nodes of the floating current source.

17. The differential amplifier of claim 16, wherein the floating current source biases the output stage with the quiescent current when the voltage difference between the differential input signals is substantially zero.

18. The differential amplifier of claim 16, wherein the input stage is a folded cascode operational transconductance amplifier (OTA), and wherein the input stage includes:
differentially coupled NMOSFETs with a drain of one of the differentially coupled NMOSFETs coupled to a first side of the first cascode current mirror and with a drain of the other of the differentially coupled NMOSFETs coupled to a second side of the first cascode current mirror; and
differentially coupled PMOSFETs with a drain of one of the differentially coupled PMOSFETs coupled to a first side of the second cascode current mirror and with a drain of the other of the differentially coupled PMOSFETs coupled to a second side of the second cascode current mirror, wherein the differential input signals are applied across gates of the differentially coupled NMOSFETs and across gates of the differentially coupled PMOSFETs.

19. The different amplifier of claim 18, wherein the floating current source is coupled between the first and second control nodes, and wherein the floating current source is comprised of:

a first cascode of a top NMOSFET and a bottom NMOSFET with a drain of the top NMOSFET coupled to the first control node and a source of the bottom NMOSFET coupled to the second control node; and a second cascode of a top PMOSFET and a bottom PMOSFET with a source of the top PMOSFET coupled to the first control node and a drain of the bottom PMOSFET coupled to the second control node;

and wherein the differential amplifier further includes:

a first biasing branch comprised of a first series of diodes coupled between the high power supply and gates of the top NMOSFET and the top PMOSFET; and a second biasing branch comprised of a second series of diodes coupled between the low power supply and gates of the bottom NMOSFET and the bottom PMOSFET.

20. The differential amplifier of claim 18, wherein the output stage includes:

a PMOSFET coupled between the high power supply and the output node and having a gate coupled to the first control node; and an NMOSFET coupled between the low power supply and the output node and having a gate coupled to the second control node.

* * * * *